United States Patent [19]

Hartman et al.

[11] 4,408,331

[45] Oct. 4, 1983

[54] V-GROOVE SEMICONDUCTOR LIGHT EMITTING DEVICES

[75] Inventors: Robert L. Hartman, Warren; Louis A. Koszi, Scotch Plains; Bertram Schwartz, Westfield, all of N.J.

[73] Assignee: Bell Telephone Laboratories, Incorporated, Murray Hill, N.J.

[21] Appl. No.: 247,627

[22] Filed: Mar. 25, 1981

[51] Int. Cl.³ .................................................. H01S 3/19
[52] U.S. Cl. ........................................ 372/46; 357/17; 357/55
[58] Field of Search ..................... 372/45, 46; 357/17, 357/55

[56] References Cited

U.S. PATENT DOCUMENTS

| | | | |
|---|---|---|---|
| 3,363,195 | 1/1968 | Furnanage et al. | 372/46 |
| 3,780,358 | 12/1973 | Thompson | 357/18 |
| 4,278,949 | 7/1981 | Marschall et al. | 372/46 |

FOREIGN PATENT DOCUMENTS

55593  4/1980  Japan .................................... 372/46

OTHER PUBLICATIONS

Gosch, "Simple Technology Irons Out Kinks in Laser Diode Output", *Electronics*, Dec. 20, 1979, vol. 52, No. 26, pp. 59–60.

Marschall et al., "A New Type of Diffused Stripe Geometry Injection Laser", *4th ECOC*, Abstract XII.6, Sep. 1978, pp. 94–97.

Casey et al., "*Heterostructure Lasers*", Academic Press, Inc., Part B, 1978, pp. 207–210.

Shumate et al., "GaAlAs Laser Transmitter for Lightwave Transmission Systems", *BSTJ*, vol. 57, No. 6, Jul.–Aug. 1978, pp. 1812–1836.

*Primary Examiner*—James W. Davie
*Attorney, Agent, or Firm*—Michael J. Urbano

[57] ABSTRACT

Semiconductor lasers and LEDs are described in which the pumping current is constrained to flow from a relatively narrow upper channel formed by a V-groove, which extends to a depth short of the active region, through a relatively wider lower channel bounded by high resistivity regions, which extend from at least that depth into or through the active region. Also described are devices in which the V-groove is refilled with semiconductor material.

19 Claims, 3 Drawing Figures

V-GROOVE SEMICONDUCTOR LIGHT EMITTING DEVICES

CROSS REFERENCE TO RELATED APPLICATIONS

This application was concurrently filed with application Ser. No. 247,523 by R. W. Dixon et al entitled "Current Confinement in Semiconductor Light Emitting Devices."

BACKGROUND OF THE INVENTION

This invention relates to light emitting semiconductor devices, such as lasers and LEDs, and more particularly to the confinement of current flow in these devices.

One of the earliest structures for confining current to flow in a relatively narrow channel through the active region of a light emitting device was the stripe geometry contact first proposed for semiconductor lasers by R. A. Furnanage and D. K. Wilson (U.S. Pat. No. 3,363,195 issued on Jan. 9, 1968). The stripe geometry reduces the threshold current for lasing (compared to broad area lasers) and limits the spatial width of the output beam. Since that early proposal, numerous laser configurations have been devised to implement the stripe geometry concept: (1) the oxide stripe laser; (2) the proton bombarded laser; (3) the mesa stripe laser; (4) the reverse-biased p-n junction isolation laser; (5) rib-waveguide lasers; and (6) buried heterostructures of various types.

The most commonly used configuration for the past eleven years, however, has been the proton bombarded, GaAs-Al GaAs double heterostructure (DH) laser described, for example, by H. C. Casey, Jr. and M. B. Panish in *Heterostructure Lasers*, Part B, pp. 207–210, Academic Press, Inc., N.Y., N.Y. (1978). Despite its various shortcomings, lasers of this type have regularly exhibited lifetimes in excess of 100,000 hours, and a number have exceeded 1,000,000 hours (based no accelerated aging tests). Long lifetimes have also been observed in DH LEDs employing similar proton bombardment to delineate the current channel.

Several of the shortcomings of proton bombarded DH lasers are discussed by R. W. Dixon et al in *The Bell System Technical Journal*, Vol. 59, No. 6, pp. 975–985 (1980). They explored experimentally the optical non-linearity (presence of "kinks" in the light-current (L-I) characteristics) and the threshold-current distribution of AlGaAs, proton-bombardment-delineated, stripe geometry DH lasers as a function of stripe width (5, 8, and 12 $\mu$m) in cases in which the protons did and did not penetrate the active layer. They demonstrated that shallow proton bombardment with adequately narrow strips (e.g., 5 $\mu$m) can result in satisfactory optical linearity (kinks are driven to non-obtrusive, high current levels) without the threshold penalty that has been associated with narrow-stripe lasers in which the protons penetrate the active layer. On the other hand, lasers with such narrow strips have exhibited a statistically meaningful, although not demonstrably fundamental, decrease in lifetime. In addition, failure of the protons to penetrate the active layer increases device capacitance and hence reduces speed of response and, moreover, increases lateral current spreading and hence increases spontaneous emission. In digital systems, the latter implies a higher modulation current to achieve a predetermined extinction ratio or a lower extinction ratio for a predetermined modulation current.

The concurrently filed application of R. W. Dixon et al, supra, describes stripe geometry, proton bombardment-delineated DH lasers in which satisfactorily high optical linearity, low capacitance, and low spontaneous emission levels are achieved by means of a current confinement scheme in which the current channel is narrower at the top near the p-side contact and wider at the bottom near the active layer. More generally, the Dixon et al application describes light emitting semiconductor devices (lasers or LEDs) having a semiconductor body, an active region within the body, and constraining means through which current flows from a major surface of the body to the active region, thereby causing radiative recombination of holes and electrons in the active region. The constraining means includes first means forming a relatively narrow first channel which extends from approximately the major surface into the body to a depth short of the active region, and second means forming a relatively wider second channel which extends from approximately that depth into or through the active region. Illustratively, the first and second means comprise high resistivity regions which bound the channel. These regions can be formed by a number of techniques including proton bombardment, oxygen bombardment, or suitable etching and regrowth of high resistivity material.

SUMMARY OF THE INVENTION

In accordance with an illustrative embodiment of our invention, a semiconductor light emitting device includes a semiconductor body having a major surface, an active region within the body, and constraining means through which current flows from the major surface to the active region, thereby causing radiative recombination of holes and electrons in the active region. The constraining means includes first means comprising an elongated groove (e.g., a V-groove) in the major surface forming a relatively narrow first channel which extends into the body to a depth short of the active region, and second means (e.g., proton bombarded zones) forming a relatively wider second channel which extends from at least that depth into or through the active region.

In an alternative embodiment, the first means includes high resistivity regions adjacent the major surface which bound at least a portion of the oblique sides of the V-groove; i.e., the V-groove penetrates through these regions. In yet another embodiment the V-groove is refilled with semiconductor material.

BRIEF DESCRIPTION OF THE DRAWING

These and other objects of our invention, together with its various features and advantages, can be readily understood from the following more detailed description taken in conjunction with the accompanying drawing. In the interests of clarity, the figures have not been drawn to scale. Where appropriate, elements common to the various figures have been given identical reference numbers.

DETAILED DESCRIPTION

General Considerations

Figure 1:
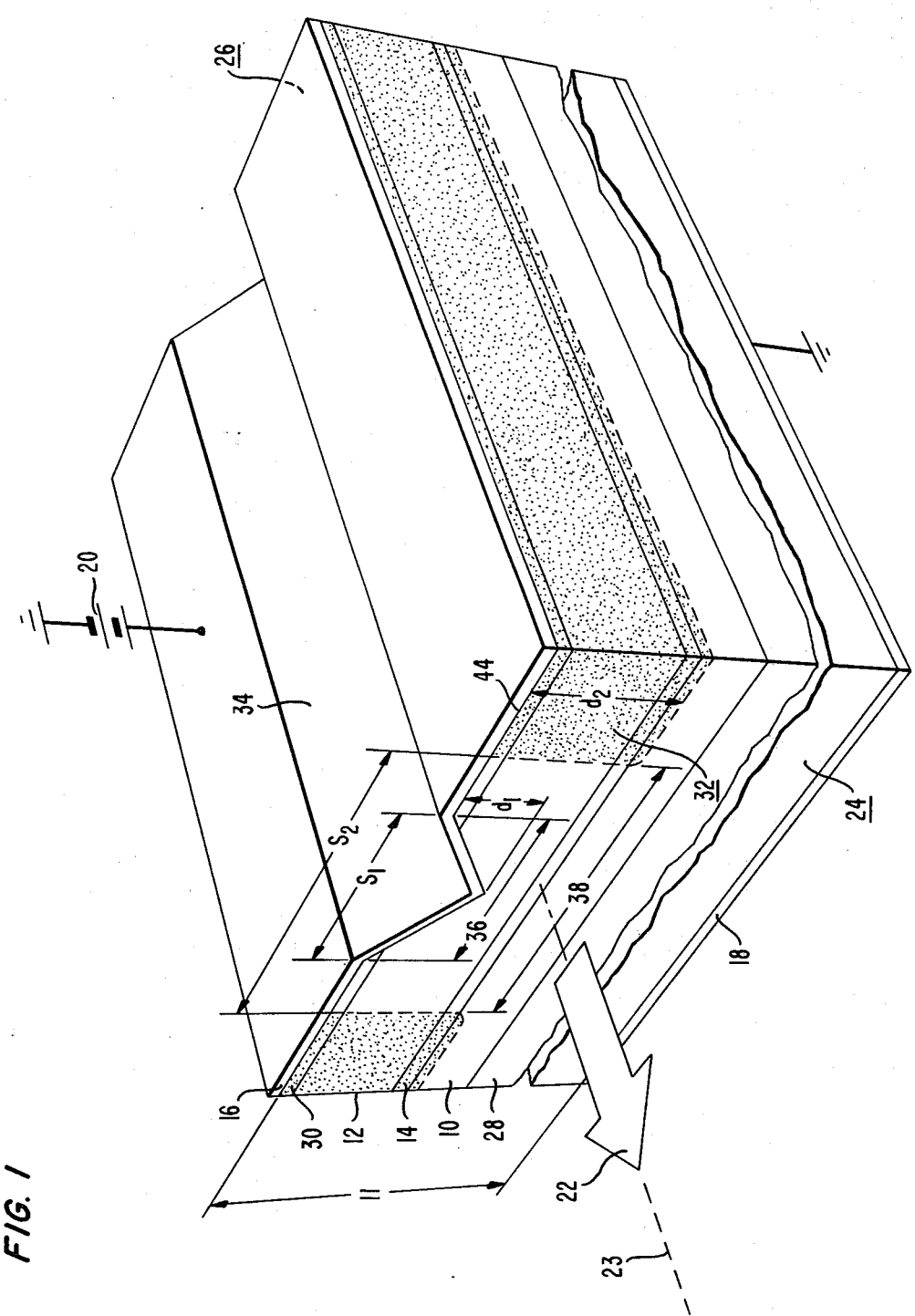
FIG. 1 is an isometrc view of a semiconductor laser or LED in accordance with one embodiment of our invention.

With reference now to FIG. 1, there is shown a semiconductor light emitting device (laser or LED) comprising a semiconductor body 11 which includes an intermediate region 14. Region 14, which may include one or more layers, includes an active region which emits predominantly stimulated radiation 22 in the case of a laser or spontaneous radiation in the case of an LED, when pumping current is applied thereto. Electrode means, illustratively contacts 16 and 18 on body 11, is provided along with a voltage source 20, to supply the pumping current. In addition, body 11 includes constraining means 32-34 which cause the pumping current to flow in a relatively narrow channel 36-38 from the top contact 16 through the active region after which the current may spread out to bottom contact 18.

Before discussing our invention in detail, it will be helpful to discuss first the general configuration of a preferred configuration of a semiconductor light emitting device known as a double heterostructure (DH). As shown in FIG. 1, a DH comprises first and second relatively wide bandgap, opposite conductivity type, semiconductor cladding layers 10 and 12, respectively, and, essentially latticed matched thereto, intermediate region 14 which is between and contiguous with the cladding layers. The intermediate region 14 includes a narrower bandgap active layer, here shown to be coextensive with the region 14, capable of emitting radiation when the cladding layers are forward biased. From the standpoint of quantum efficiency, the active layer is preferably a direct bandgap semiconductor. Layers 10, 12, and 14 can be made of materials selected from a number of systems; for example, GaAs-AlGaAs or GaAsSb-AlGaAs, for operation at short wavelengths in the 0.7-0.9 $\mu$m range approximately, and InP-InGaAsP or InP-AlGaInAs for operation at wavelengths longer than about 1 $\mu$m (e.g., 1.1-1.6 $\mu$m).

Voltage source 20 forward biases the cladding layers and thereby injects carriers into the active layer. These carriers recombine to generate spontaneous radiation in the case of an LED and predominantly stimulated radiation in the case of a laser. In either case, however, the radiation has a wavelength corresponding to the bandgap of the active layer material. Moreover, in the case of a laser the radiation 22 is emitted in the form of a collimated beam along a resonator axis 23 perpendicular to a pair of mirrors 24 and 26 formed illustratively by cleaved crystal facets or etched surfaces. These mirrors constitute optical feedback means for generating stimulated radiation. In other applications, for example integrated optics, diffraction gratings may be employed as a substitute for one or both of the mirrors.

Although the electrode means depicted in the device of FIG. 1 includes broad area contacts 16 and 18 suitable for use in a laser or edge emitting LED, it is well known in the art that these contacts can be patterned to form various geometrical shapes. Thus, in an LED contact 16 may be a broad area contact, but contact 18 may be an annular ring (not shown) which accommodates an etched hole (not shown) in one side of body 11. Where the bottom portion (e.g., substrate 28) of body 11 in absorbing, this etched hole can be used to couple radiation propagating perpendicular to the layers into an optical fiber (not shown) positioned in the hole.

Figure 3:
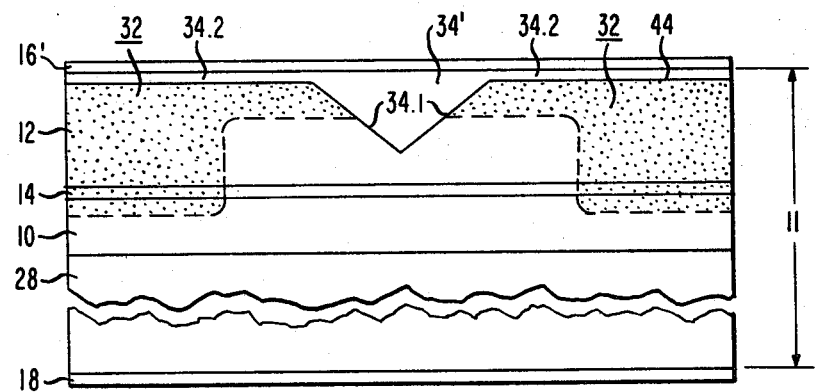
FIG. 3 is a cross-sectional view of a laser or LED in accordance with yet another embodiment of our invention in which the V-groove is refilled with semiconductor material.

The conductivity type of the active layer is not critical. It may be n-type, p-type, intrinsic or compensated since in typical modes of operation under forward bias the number of injected carriers may exceed the doping level of the active layer. In addition, the intermediate region 14 may include multiple layers which constitute an active region, e.g. contiguous p- and n-type layers of the same bandgap forming a p-n homojunction or of different bandgaps forming a p-n heterojunction. Furthermore, the heterostructure may take on configurations other than the simple double heterostructure including, by way of example but without limitation, separate confinement heterostructures as described by I. Hayashi in U.S. Pat. No. 3,691,476, strip buried heterostructures of the type described by R. A. Logan and W. T. Tsang in U.S. Pat. No. 4,190,813, and isotype heterostructures of the type described by R. L. Hartman et al in U.S. Pat. No. 4,313,129. In the latter case of a DH isotype laser, the cladding layers are of the same conductivity type, and the p-n junction is located external to, but within a diffusion length of, the active region. One embodiment of our invention, described infra with respect to FIG. 3, is a V-groove isotype DH laser or LED.

For CW laser operation at room temperature, the thickness of the active layer is preferably between approximately $\lambda/2$ and 1.0 $\mu$m, where $\lambda$ is the wavelength of the radiation as measured in the semiconductor. For low threshold operation, the thickness is typically 0.12 to 0.20 $\mu$m. However, for LED operation a thicker active layer, typically 2 to 3 $\mu$m, is suitable. In either case, for room temperature operation the laser or LED is typically bonded to a suitable heat sink, not shown.

In practice, the layers of a double heterostructure are typically grown by an epitaxial process such as liquid phase epitaxy (LPE), molecular beam epitaxy (MBE), or metallo-organic chemical vapor deposition (MOCVD). Epitaxial growth takes place on a single crystal substrate 28 which may include a buffer layer (not shown) between the substrate 28 and the first cladding layer 10. Also, a contact facilitating layer 30 is optionally included between the second cladding 12 and the top contact 16. The opposite contact 18 is formed on the bottom of substrate 28.

As mentioned previously, in order to constrain the pumping current generated by source 20 to flow in a relatively narrow channel 36-38 through the active region, constraining means 32-34 is provided in body 11.

Basic V-Groove Structures

In accordance with an illustrative embodiment of our invention as shown in FIG. 1, current constraining means 32-34 includes first means 34 defining a relatively narrow upper channel 36 and second means 32 defining a relatively wider lower channel 38. Illustratively, the constraining means comprises V-groove first means 34 which extends from major surface 44 to a depth $d_1$ short of the active region, thereby defining relatively narrow upper channel 36; and further comprises laterally separate, high resistivity regions 32 which bound lower wider channel 38, and which extend from at least depth $d_1$ approximately, to the active region (i.e., into or through the active region). As shown, separated regions 32 illustratively extend from surface 44 and preferably through the active region. V-groove 34 is positioned within the space between regions 32. However, it is not essential that the high resistivity regions 32 actually reach all the way to the major surface 44. In fact, for contacting purposes it may be advantageous to have a high conductivity layer interposed between regions 32 and contact 16 as described by R. W. Dixon et al in U.S. Pat. No. 4,124,826.

With reference to the DH of FIG. 1, the V-groove 34 has a width $S_1$ at major surface 44 and a depth $d_1$ where it penetrates second cladding layer 12, thereby defining upper channel 36 as having essentially the same width. In contrast, the high resistivity regions 32 are separated by a wider distance $S_2 > S_1$ and extend from surface 44 to a depth $d_2 > d_1$ into and preferably through the active region, thereby defining the wider lower channel 38 of width $S_2$.

Figure 2:
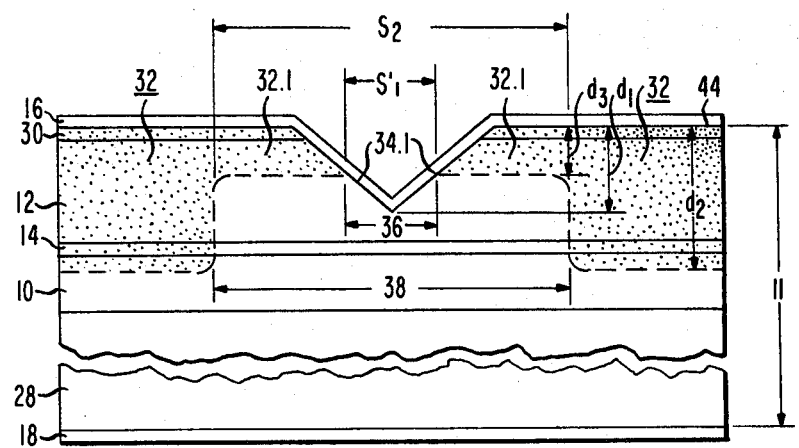
FIG. 2 is a cross-sectional view of a laser or LED in accordance with another embodiment of our invention in which the V-groove penetrates a high resistivity region.

Alternatively, as shown in FIG. 2, the upper channel 36 can be further restricted by additional high resistivity regions 32.1 which bound a portion of the oblique sides 34.1 of V-groove 34, thus defining the upper channel width $S_1'$ of FIG. 2 as being less than $S_1$ of FIG. 1. In practice, the regions 32 and 32.1 can be fabricated (e.g., by proton bombardment) to depths of $d_2$ and $d_3$, respectively ($d_2 > d_3$); and then the V-groove 34 can be etched to a depth $d_1$ so as to penetrate the regions 32.1 ($d_3 < d_1 < d_2$).

These V-groove configurations are expected to exhibit several advantages. First, the narrow upper channel 36 increases the current density in the active region and thereby causes kinks in lasers to be shifted to higher current levels out of the range of typical operation. Second, this feature should also result in more uniformly distributed lasing thresholds and lower lasing thresholds, providing higher device yields. Third, because the wider lower channel 38 reduces lateral current diffusion and spreading, less spontaneous radiation is emitted outside the resonator of the laser, thereby allowing for a lower modulation current for a predetermined extinction ratio in digital applications. Fourth, the latter feature results in reduced device capacitance for both lasers and LEDs, thereby permitting higher speed of operation (i.e., higher pulse repetition rates in digital applications).

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, the V-groove 34 of FIG. 1 or FIG. 2 may be refilled with semiconductor material, resulting in devices (especially lasers) with several useful characteristics as discussed below. Moreover, although the groove has been described as a V-groove, its precise geometrical shape is not critical. A V-groove results when III-V semiconductors are subject to certain etchants which preferentially etch crystallographic planes, but V-groove or rectangular grooves might result from other etchants or other processes (e.g., ion beam milling or plasma etching).

Refilled V-Groove Structures

As shown in FIG. 3, the V-groove has been filled with semiconductor material 34' and, depending on the procedure used to effect refilling, may or may not result in formation of layers 34.2 which are adjacent the V-groove and on major surface 44. Moreover, depending on the material of cladding layer 12 and the type of procedures used, material 34' may or may not be epitaxial (i.e., monocrystalline).

Several embodiments result depending on the relative size of the bandgaps $E_g$ of the DH layers relative to that of V-groove material 34'. Case I: $E_g(34') > E_g(14)$; that is, the V-groove material 34' has a larger bandgap than the active layer 14. As a consequence, laser radiation penetrating V-groove material 34' experiences reduced absorption as compared with FIG. 1. Case II: $E_g(34') > E_g(12) > E_g(14)$; in addition, cladding layers 10 and 12 and the active layer 14 all have the same conductivity type, and V-groove material 34' and cladding layer 12 have opposite conductivity types. This configuration is a form of isotype laser in which the p-n junction is located along oblique surfaces 34.1. In this case, the V-groove material 34' is preferably monocrystalline. Case III: $E_g(12) > E_g(34') > E_g(14)$; that is, the V-groove material 34' has a lower bandgap than cladding layer 12 but a higher bandgap than active layer 14. As a consequence the refractive indices n have the relationship $n(14) > n(34') > n(12)$ so that the laser radiation would be refractive index guided along the V-groove.

What is claimed is:

1. In a semiconductor light emitting device, a semiconductor body comprising
    electrode means for applying current to said body,
    an active region in which optical radiation is generated when current flows therethrough, and
    means for constraining said current to flow from a major surface of said body in a channel through said active region,
    said constraining means comprising
        elongated groove first means for causing said current to flow in relatively narrow upper channel which extends from said surface to a depth short of said active region, and
        second means for causing said current flow in relatively wider lower channel which extends from at least said depth to said active region.

2. The body of claim 1 wherein said second means comprises a pair of laterally separate, high resistivity second regions bounding said lower channel.

3. The body of claim 2 wherein said second regions extend through said active region.

4. The body of claim 2 wherein said first means comprises
    a portion of said surface having a V-groove formed therein, and
    a pair of laterally separate high resistivity first regions bounding at least a portion of the oblique sides of said V-groove, so that said V-groove penetrates through said first regions.

5. The body of claims 2, 3, or 4 wherein said high resistivity regions comprises proton bombarded zones.

6. The body of claims 2, 3, or 4 wherein said body comprises
    a first cladding layer,
    a second cladding layer nearer said major surface than said first layer,
    said active region comprising an active layer between said cladding layers, and wherein
    said groove means extends from said surface to said depth located in said second cladding layer, and
    said lower channel extends from at least said depth through said active layer.

7. The body of claims 1 or 4 wherein said first means comprises a portion of said surface having a groove formed therein, and further including semiconductor material filling said groove.

8. The body of claim 7 wherein said material has a larger bandgap than the adjacent portions of said body.

9. The body of claim 8 wherein said material has the same conductivity type as said adjacent portions.

10. The body of claim 8 wherein said material has an opposite conductivity type to said adjacent portions, thereby forming a p-n junction at the sides of said groove effective to inject carriers into said active region.

11. The body of claim 7 wherein said material has a smaller bandgap than the adjacent portions of said body and a larger bandgap than said active region.

12. A double heterostructure semiconductor laser comprising
- a semiconductor body having a major surface and including first and second cladding layers and an active layer therebetween,
- electrode means for applying pumping current to flow from said surface through said active layer, thereby resulting in the emission of stimulated radiation from said active layer,
- optical feedback means for resonating said radiation along an axis parallel to said layers, and
- means for constraining said pumping current to flow in a channel from said major surface through said active layer, said constraining means comprising
    V-groove first means for causing said current to flow in a relatively narrow upper channel which extends from said major surface to a depth short of said active layer, and
    second means for causing said current to flow in a relatively wider lower channel which extends from at least said depth through said active layer.

13. The laser of claim 12 wherein
said first means comprises a portion of said surface having a V-groove formed therein, and
said second means comprises a pair of laterally separate, high resistivity, proton bombarded second regions bounding said lower channel.

14. The laser of claim 13 wherein said first means comprises a pair of laterally separate, high resistivity, proton bombarded first regions bounding at least a portion of the oblique sides of said V-groove, so that said V-groove penetrates through said first regions.

15. The laser of claims 12, 13, or 14 wherein said first means comprises a portion of said surface having a V-groove therein which penetrates said first cladding layer, and further including semiconductor material filling said V-groove.

16. The laser of claim 15 wherein said material has a larger bandgap than said first cladding layer.

17. The laser of claim 16 wherein said material has the same conductivity type as said first cladding layer.

18. The laser of claim 16 wherein said cladding layers have the same conductivity type and said material has a conductivity type opposite to that of said first cladding layer, thereby forming a p-n junction at the oblique sides of said V-groove effective to inject carriers into said active region.

19. The laser of claim 15 wherein said material has a smaller bandgap than said first cladding layer and a larger bandgap than said active layer.

* * * * *